United States Patent
Wu et al.

(10) Patent No.: US 10,056,988 B2
(45) Date of Patent: Aug. 21, 2018

(54) WIRELESS DEVICE WITH A MULTI-TURN DIRECTIONAL COUPLER

(71) Applicant: Intel IP Corporation, Santa Clara, CA (US)

(72) Inventors: Jianxin Wu, Sunnyvale, CA (US); Lei Feng, Hillsboro, OR (US)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/195,165

(22) Filed: Jun. 28, 2016

(65) Prior Publication Data

US 2017/0373767 A1    Dec. 28, 2017

(51) Int. Cl.

| | |
|---|---|
| *H01P 5/18* | (2006.01) |
| *H04B 17/10* | (2015.01) |
| *H03F 1/02* | (2006.01) |
| *H03F 3/19* | (2006.01) |
| *H03F 3/21* | (2006.01) |
| *H03H 7/38* | (2006.01) |
| *H04B 1/04* | (2006.01) |

(52) U.S. Cl.
CPC ........... *H04B 17/103* (2015.01); *H01P 5/184* (2013.01); *H03F 1/0233* (2013.01); *H03F 3/19* (2013.01); *H03F 3/21* (2013.01); *H03H 7/38* (2013.01); *H04B 1/04* (2013.01); *H04B 17/104* (2015.01); *H03F 2200/393* (2013.01); *H03F 2200/451* (2013.01); *H03F 2200/465* (2013.01)

(58) Field of Classification Search
CPC ............. H01P 5/18; H01P 5/184; H01P 5/185
USPC .................................. 333/109–116
See application file for complete search history.

(56) References Cited

U.S. PATENT DOCUMENTS

| | | | |
|---|---|---|---|
| 9,123,982 B2* | 9/2015 | Ye ........................... | H01P 5/187 |
| 2008/0207159 A1 | 8/2008 | Liu | |
| 2011/0063044 A1 | 3/2011 | Jones | |
| 2012/0019335 A1* | 1/2012 | Hoang .................... | H01P 5/184 |
| | | | 333/116 |
| 2013/0141183 A1 | 6/2013 | Ye et al. | |

(Continued)

FOREIGN PATENT DOCUMENTS

WO        2018004899        1/2018

OTHER PUBLICATIONS

"Directional Coupler", Mini Circuits ZUDC-Series, 3 pgs.

(Continued)

*Primary Examiner* — Simon Nguyen
(74) *Attorney, Agent, or Firm* — Schwegman Lundberg & Woessner, P.A.

(57) ABSTRACT

A directional coupler disclosed herein may include a main line provided on a substrate, the main line having a first end connected to an input port and a second end connected to an output port. The coupler may include a coupled line disposed on the substrate, the coupled line having a first end connected to a coupled port and a second end to an isolated port. The main line is electrically isolated from the coupled line. The coupled line includes multiple turns forming a winding, and a portion of the winding overlaps with the main line. The coupled line forms a plurality of windings inductively coupled with the main line. The main line and the coupled line are routed to propagate electric signals on both lines in a same direction, and enhance inductive coupling by mutual inductance.

22 Claims, 4 Drawing Sheets

(56) References Cited

U.S. PATENT DOCUMENTS

| | | | |
|---|---|---|---|
| 2015/0102870 A1* | 4/2015 | Su | H01P 5/107 333/113 |
| 2015/0109069 A1* | 4/2015 | Katabuchi | H01P 5/184 333/116 |
| 2015/0311577 A1* | 10/2015 | Yamatogi | H01P 5/187 333/116 |
| 2016/0028144 A1 | 1/2016 | Katabuchi et al. | |
| 2016/0028146 A1* | 1/2016 | Zhang | H01P 5/184 333/112 |
| 2016/0056521 A1* | 2/2016 | Meharry | H01P 5/187 333/116 |
| 2016/0079650 A1* | 3/2016 | Solomko | H03H 7/48 333/103 |
| 2016/0172740 A1* | 6/2016 | Srirattana | H01P 5/185 333/111 |

OTHER PUBLICATIONS

Kim, Wan-Kyu, et al., "A Passive Circulator for RFID Application with High Isolation using a Directional Coupler", Proceedings of the 36th European Microwave Conference, (Sep. 2006), 196-199.

Zhu, Yunliang, et al., "A 10-40 GHz 7 dB Directional Coupler in Digital CMOS Technology", 2006 International Microwave Symposium, (2006), 1551-1554.

"International Application Serial No. PCT/US2017/034440, International Search Report dated Aug. 22, 2017", 3 pgs.

"International Application Serial No. PCT/US2017/034440, Written Opinion dated Aug. 22, 2017", 10 pgs.

\* cited by examiner

WIRELESS DEVICE WITH A MULTI-TURN DIRECTIONAL COUPLER

TECHNICAL FIELD

Embodiments pertain to radio frequency (RF) communications. Some embodiments relate to RF directional couplers. Some embodiments pertain to wireless communication devices. Some embodiments pertain to front-end circuitry for wireless communication devices. Some embodiments pertain to transmitters, including transmitters and transmitter circuitry for wireless devices, including Wi-Fi devices.

BACKGROUND

Directional couplers are passive devices used in RF communications to couple part of the transmission power in a first transmission line to a second transmission line. The coupling between the two transmission lines can be achieved by placing the two lines close to each other so that energy passing through the first line is coupled to the second line. With the increased drive for miniaturizing circuit components, conventional directional couplers can have small dimensions of both transmission lines. Even though such miniaturization can reduce the RF power loss in the main (first) transmission line, conventional miniaturized directional couplers are also characterized by very low directivity due to area limitation, which is undesirable in RF circuit design.

BRIEF DESCRIPTION OF THE FIGURES

In the figures, which are not necessarily drawn to scale, like numerals may describe similar components in different views. Like numerals having different letter suffixes may represent different instances of similar components. Some embodiments are illustrated by way of example, and not limitation, in the following figures of the accompanying drawings.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Given the benefit of the present disclosure, persons skilled in the relevant technologies will be able to engineer suitable variations to implement principles of the embodiments in other types of communication systems. Various diverse embodiments may incorporate structural, logical, electrical, process, and other differences. Portions and features of some embodiments may be included in, or substituted for, those of other embodiments. Embodiments set forth in the claims encompass all presently-known, and after-arising, equivalents of those claims.

Figure 1:
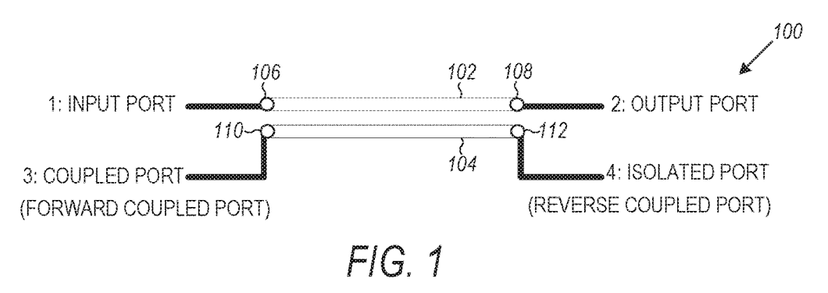
FIG. 1 is a diagram of a directional coupler in accordance with some embodiments.

FIG. 1 is a diagram of a directional coupler in accordance with some embodiments. Referring to FIG. 1, the directional coupler 100 can include a main line 102 and a coupled line 104. The main line 102 can be coupled at one end to an input port 106 of the coupler, and at another end, to an output port 108. The coupled line 104 can be coupled to a coupled port 110 and an isolated port 112.

The coupler 100 is a passive device designed to couple a desired fraction of radio frequency (RF) power travelling in the main transmission line 102 to another transmission line (i.e., the coupled transmission line 104). The RF power is transferred between the lines due to RF coupling, without any direct connection between the main line 102 and the coupled line 104.

In operation, the input port 106 may be coupled to a power amplifier, and the output port 108 can be coupled to an antenna. The amplifier can generate a transmit signal, which can travel via the main line 102 to the antenna coupled to the output port 108. A fraction of the input power of the transmit signal will be transferred to the coupled port 110 due to the coupling between the two transmission lines 102 and 104 (the longer the coupled lines, the higher the degree of coupling and the higher the signal power at the coupled port 110).

The isolated port 112 can be used to monitor power of a reflected signal from the antenna coupled to the output port 108. The reflected signal can correspond to the transmit signal, and can occur due to mismatch of antenna impedance at the output port 108 with impedance at port 108 (which includes both coupler impedance and power amplifier impedance at the input port 106). In instances of an ideal coupler 100 that is perfectly matched, the isolated port 112 will not have RF power transferred from the input port 106 or the output port 108. In reality, the coupler 100 will have some degree of antenna mismatch and RF power will be transferred to the isolated port 112 from the input port 106 and/or the output port 108. In some examples, the coupled port 110 is also referred to as a forward coupled port (as it can be used to detect power of the transmit signal, or forward power), and the isolated port 112 is also referred to as a reverse coupled port (as it can be used to detect power of the reflected signal reflected back from the antenna due to antenna impedance mismatch). An example circuit implementation is disclosed herein with regard to FIG. 2A.

The coupler 100 can be used in RF device applications, such as power sensing applications and automatic power control applications using feedback systems coupled to the coupled port 110 and/or the isolated port 112.

In an example, the following characteristics can be used to assess efficacy of directional couplers: main line loss (or insertion loss), coupling loss, isolation, and directivity. Insertion loss can be characterized as the signal power loss from the input port 106 to the output port 108 (a smaller insertion loss is a preferred characteristic). The insertion loss is due to resistance, but can also be due to magnetic, capacitive and/or dielectric losses. The main line (or insertion) loss can be expressed in terms of a scattering parameter (S-parameter), such as $S_{21}$, which can provide the power loss (e.g., in dB) of the signal at port 108 when compared to the signal at port 106.

Coupling loss can be characterized as the portion of the power that is transferred from the main line 102 to the coupled port 110. In an example, the isolated port 112 has negligible power loss, while the transferred power at the coupled port 110 is at a desired level. The coupling loss can be expressed in terms of an S-parameter, such as $S_{31}$, which can provide the power loss (e.g., in dB) of the signal at port 110 when compared to the signal at port 106.

Isolation can be characterized as the portion of the power that is transferred from the input port 106 to the isolated port 112 (i.e., the power level difference between the isolated port 112 and the input port 106) (a higher isolation is a preferred characteristic). The isolation can be expressed in terms of an S-parameter, such as $S_{41}$, which can provide the power loss (e.g., in dB) of the signal at port 112 when compared to the signal at port 106.

Directivity can be characterized as the power level difference between the signal power level at the coupled port 110 and the isolated port 112 (a higher directivity is a preferred characteristic). The directivity can be expressed in terms of an S-parameter, such as the difference ($S_{31}-S_{41}$), which can provide the power level difference (e.g., in dB) of the signal at port 110 when compared to the signal at port 112.

With the development of advanced silicon processing technologies, RF couplers could be made on-chip together with integrated circuits using digital processing technologies. For example, RF directional couplers as disclosed herein can be used in RF transceiver integrated circuit (IC) chips as power detectors and/or as power sensing element for, e.g., automatic power control schemes for adjusting transmit signal power, or for adjusting magnitude/phase of a transmit signal.

When integrated on a silicon chip with RF transceivers, an RF directional coupler may take significant silicon area in order to achieve the desired directivity. In instances when the coupler is implemented in a small silicon area (e.g., by using short main and coupled lines), the coupler's performance can be significantly compromised (e.g., the directivity can be substantially reduced below an acceptable level).

In accordance with an example embodiment, a directional coupler can be implemented using a multi-turn coupled line, where the coupled line forms one or more windings that overlap (at least partially) with the main line. The main line can be provided using a metallic strip that has width higher than a width of a conductor used for the coupled line. In this regard, by keeping the main line with higher width and shorter length compared to the coupled line, main line losses are reduced. Additionally, by having a coupled line that is longer (and narrower) than the main line, the coupler's directivity is significantly improves, while keeping the overall footprint of the coupler within a small silicon area.

Figure 2A:
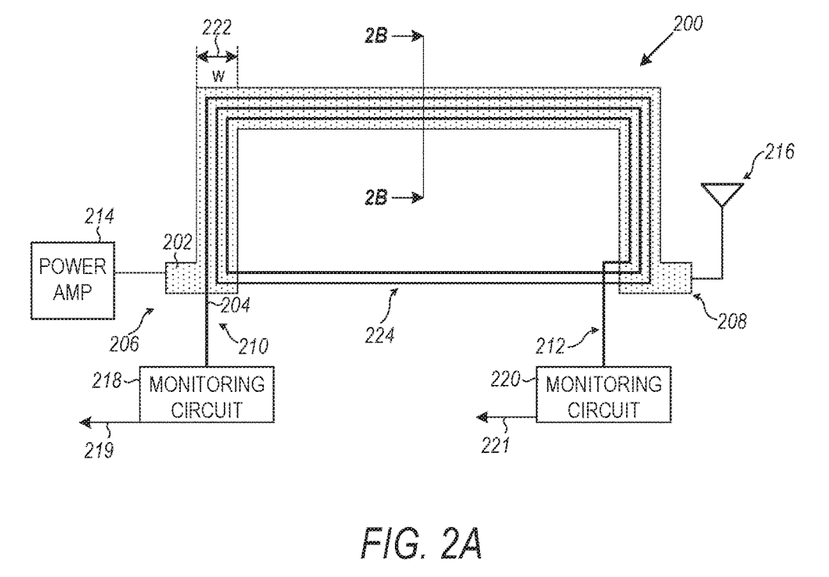
FIG. 2A is a diagram of a multi-turn directional coupler in accordance with some embodiments.

FIG. 2A is a diagram of a multi-turn directional coupler in accordance with some embodiments. Referring to FIG. 2A, the directional coupler 200 can include a main line 202 and a coupled line 204. The main line 202 can be coupled at one end to an input port 206 of the coupler 200, and at another end, to an output port 208. The coupled line 204 can be coupled to a coupled port 210 and an isolated port 212 (the coupled line 204 near the isolated port 212 does not intersect with itself as it appears in FIG. 2A; in this regard, the portion of line 204 near the isolated port 212 may be on a different metal layer so as to avoid shorts with other portions of line 204).

In an example, the coupled line 210 of the directional coupler 200 can be routed in multiple turns under (or over) the main line 202 so that the coupled line forms at least one winding 224, where a portion of each winding overlaps with the main line 202. As seen in FIG. 2A, about three quarters of each winding overlaps with substantially the entire contour (or outline) of the main line 202. Additionally, the main line 202 can be a metal strip with a width (w) 222, which can be larger than a width of a conductor (e.g., metallic trace) used for the coupled line 204. By having a width 222 that is larger than the width of the conductor of line 204, main line loss can be minimized, while still providing sufficient surface of the main line 202 so as to cover one or more windings formed by the coupled line 204.

In an example, some (or all) of the traces associated with the coupled line 204 may not overlap with the main line 202. In this instance, at least a portion of the coupled line may be routed to run in parallel with at least a portion of the main line so that there is coupling between the main and the coupled line. In instances when the two lines do not overlap, both the main and the coupled lines may be on the same metal layer.

Even though specific widths of the main line 202 and the coupled line 204, as well as specific shape/configuration for both lines 202 and 204, are illustrated in FIG. 2A, the disclosure is not limited in this regard and other configurations are possible. For example, the main line 202 can be configured in a shape other than a rectangular shape, and the windings of the coupled line 204 (e.g., 224) can be configured to trace (at least partially) the main line 202 in a shape also other than a rectangular shape as illustrated in FIG. 2A. Even though two complete windings 224 are illustrated in FIG. 2A, other number of windings can be used as well. For example, the number of windings 224 can be determined based on desired directivity (e.g., based on desired impedance between ports 210 and 212) or desired coupling characteristics of the coupler 200.

Figure 2B:
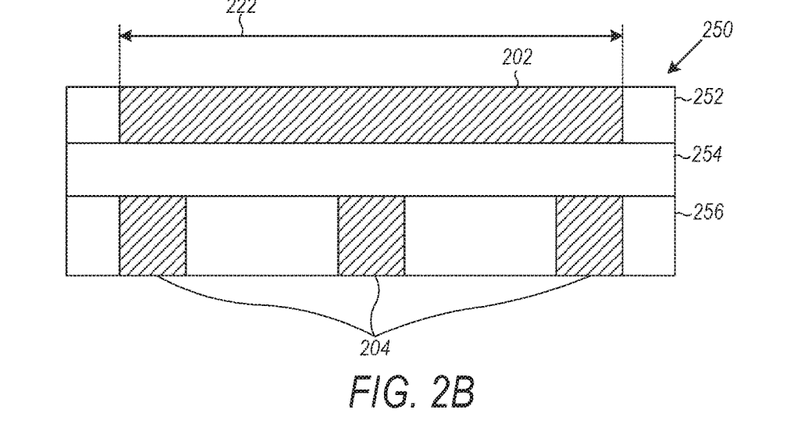
FIG. 2B is a cross-sectional view of a portion of the substrate used by the multi-turn directional coupler of FIG. 2A in accordance with some embodiments.

In an example, the coupler 200 can be implemented on a substrate, such as substrate 250 in FIG. 2B. FIG. 2B is a cross-sectional view of a portion of the substrate used by the multi-turn directional coupler of FIG. 2A in accordance with some embodiments. Referring to FIG. 2A and FIG. 2B, the substrate 250 can include a first metallic layer 252, a second metallic layer 256, and an isolation layer 254, between layers 252 and 256. As seen in FIG. 2B, the main line 202 can be provided in the top metallic layer 252, and the coupled line 204 can be provided in the bottom metallic layer 256 (layer 256 can be used for providing all windings 224 associated with the coupled line 204). Additionally, and as seen in FIG. 2B, the width of the main line 202 is sufficiently large to overlap all of the traces for coupled line 204 (e.g., width of the main line 202 trace is at least three times the width of the coupled line 256 trace to ensure that the windings 224 are, at least in part of the windings, overlapping with the main line 202).

Even though the main line 202 is illustrated as implemented in the top substrate layer 252, the disclosure is not limited in this regard, and the main line can be implemented in the bottom substrate layer 256 (and the coupled line 204 being implemented in the top substrate layer 252). Additionally, both the main line and the coupled line may be implemented on the same metal layer, as explained above.

Figure 5:
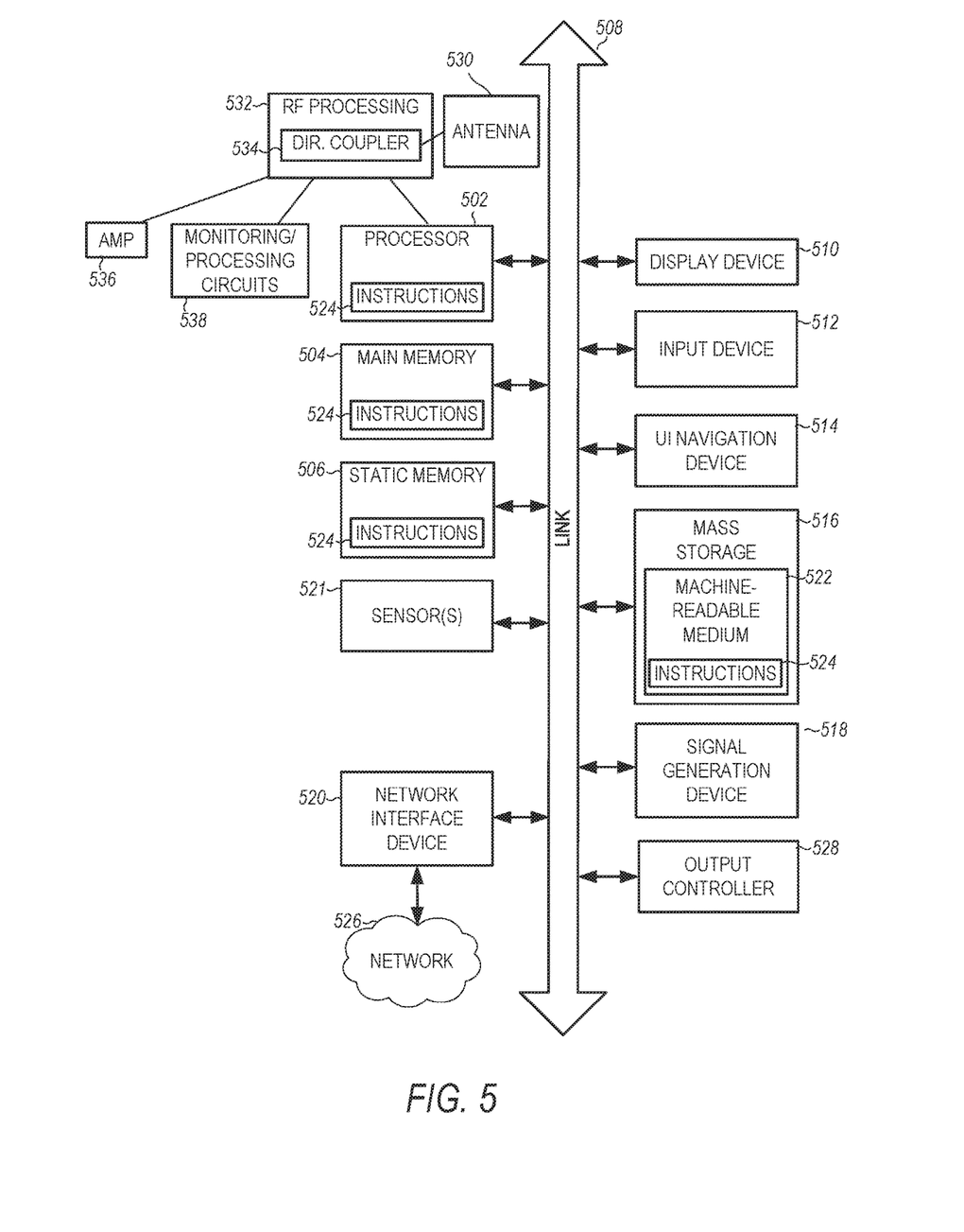
FIG. 5 is a block diagram illustrating an example device in accordance with some embodiments.

In an example, the coupler 200 can be part of a wireless transceiver, such as a Wi-Fi or a cellular transceiver of a wireless device (e.g., device 500 in FIG. 5). More specifically, the input port 206 can be connected to a power amplifier 214, and the output port 208 can be connected to an antenna (or an antenna array) 216. The coupled port 210 and the isolated port 212 can be connected to monitoring circuits 218 and 220, respectively.

The amplifier 214 can generate a transmit signal, which can travel via the main line 202 to the antenna 216 connected to the output port 208. A fraction of the input power of the transmit signal will be transferred to the coupled port 210 due to the coupling between the two transmission lines 202 and 204. The monitoring circuit 220 at the isolated port 204 can be used to dynamically monitor power of a reflected signal from the antenna 216. The reflected signal can correspond to the transmit signal, and can occur due to mismatch of antenna impedance at the output port 208 with impedance of coupler at port 208 as well as impedance of one or more circuits at the input port 206 (e.g., a power amplifier at the input port 206). The monitoring circuit can then generate a feedback signal 221 used to adjust antenna impedance, or otherwise, adjust the antenna mismatch so that it is reduced to an optimal level.

The monitoring circuit 218 at the coupled port 210 can be used to monitor the forward power of the transmit signal output by the amplifier 214. Additionally, the monitoring circuit 218 can generate a feedback signal 219, which can be used to adjust the transmit power and/or to adjust magnitude (and/or phase) of the transmit signal to a desired level.

In an example, metal shielding can be provided within the windings 224 formed by the coupled line 204. The metal shielding may include metallic strips (or other types of shielding configurations), which may be used to prevent the coupler 200 from picking up stray interferences.

Figure 3A:
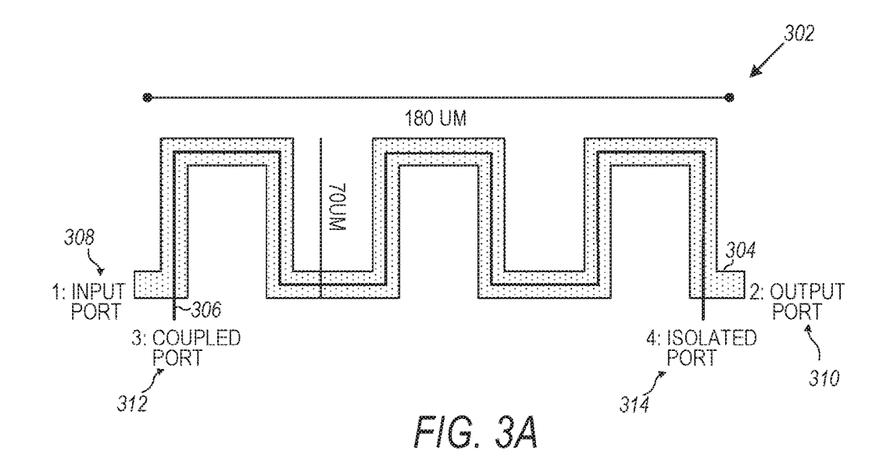
FIG. 3A and FIG. 3B illustrate single-turn directional couplers in accordance with some embodiments.

FIG. 3A and FIG. 3B illustrate single-turn directional couplers in accordance with some embodiments. FIG. 3A illustrates a coupler 302 that includes a main line 304 and a coupled line 306. The main line 304 can include an input port 308 and an output port 310. The coupled line 306 can include a coupled port 312 and an isolated port 314. In an example, the overall width and height of the coupler 302 can be approximately 180 um×70 um (as illustrated in FIG. 3A).

Figure 3B:
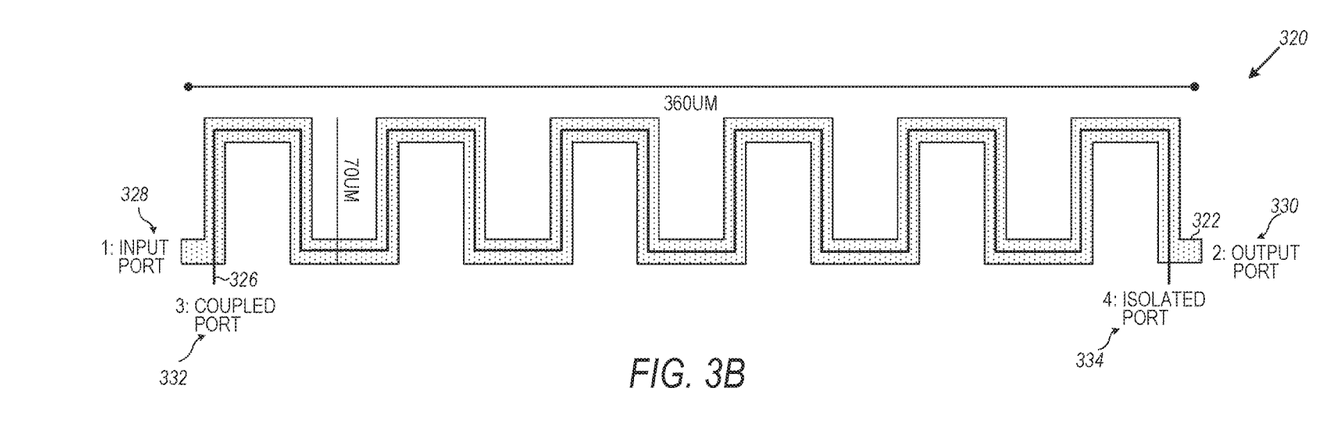

FIG. 3B illustrates a coupler 320 that includes a main line 322 and a coupled line 326. The main line 322 can include an input port 328 and an output port 330. The coupled line 326 can include a coupled port 332 and an isolated port 334. In an example, the overall width and height of the coupler 320 can be approximately 360 um×70 um (as illustrated in FIG. 3B).

As seen in FIGS. 3A and 3B, the couplers 302 and 320 include coupled lines 306 and 326 that do not form any windings. A comparison of the S-parameters for the couplers in FIGS. 2A, 3A, and 3B is illustrated below in Table 1. More specifically, the coupler 200 is configured with the same dimensions (180 um×70 um) as coupler 302. For obtain the data in Table 1, RF directional coupler performance for couplers 200, 302 and 320 is simulated at 2.5 GHz with 50 Ohm resistive load connected to each of the four ports of the couplers.

TABLE 1

| | Main Line (Insertion) Loss, S21 (dB) | Coupling, S31 (dB) | Isolation, S41 (dB) | Directivity, S31 − S41 (dB) |
|---|---|---|---|---|
| FIG. 2A Coupler | −0.086 | −20.8 | −39.6 | 18.8 |
| FIG. 3A Coupler | −0.153 | −19.8 | −25.7 | 5.9 |
| FIG. 3B Coupler | −0.320 | −19.6 | −38.4 | 18.8 |

As seen in Table 1 above, coupler 302 (FIG. 3A) is characterized with coupling attenuation (S31) of about −20 dB, which is the same as the multi-turn coupler 200 (FIG. 2A). However, the directivity of the coupler 302 is 5.9 dB, which is significantly lower than the directivity (18.8 dB) of coupler 200.

Additionally, coupler 320 (FIG. 3B) is characterized with coupling attenuation (S31) of about −20 dB and directivity of 18.8 dB, which are the same as the multi-turn coupler 200 (FIG. 2A). However, the main line loss (S21) of the coupler 320 is 0.320 dB, which is significantly higher than the main line loss (−0.086 dB) of coupler 200.

In this regard, the multi-turn directional coupler 200 of FIG. 2A has overall better performance in comparison to the couplers 302 and 320. Some advantages include:

(1) The surface area of coupler 200 is as small as the surface area of coupler 302, but with significantly higher directivity in comparison with coupler 302. To achieve the same directivity, the main and coupled lines have to be twice as long in comparison to coupler 302 (e.g., coupler 320 is twice as long as coupler 302), which contributes to increased silicon area and is undesirable.

(2) A higher directivity of 18.8 dB can be achieved with coupler 200.

(3) The main line (resistive) loss S21 in the main line (−0.086 dB) is smaller than the main line loss for both couplers 302 and 320 (with main line loss of coupler 320 being significantly higher due to the longer main and coupled lines).

(4) A desired coupling characteristic of about −20 dB is met by the coupler 200.

Figure 4:
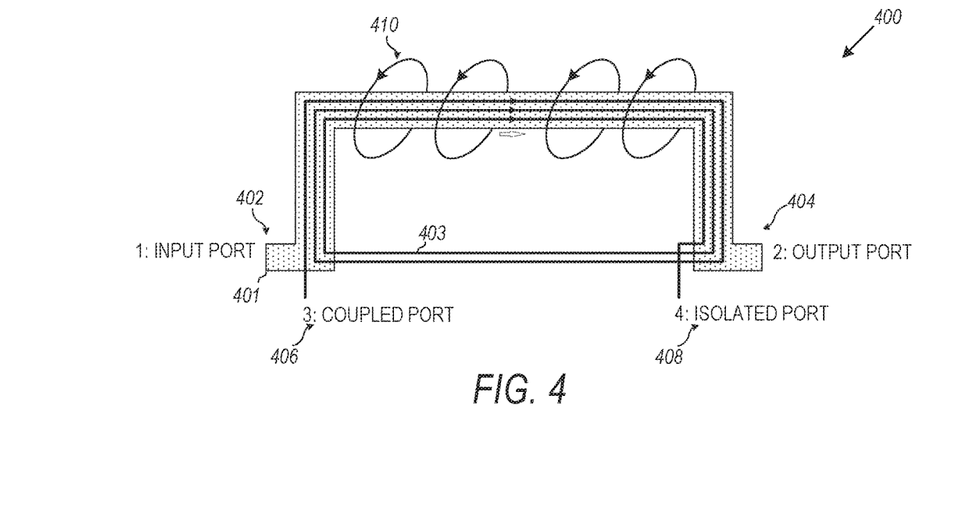
FIG. 4 is a diagram of the multi-turn directional coupler of FIG. 2A with enhanced inductive coupling in accordance with some embodiments.

FIG. 4 is a diagram of the multi-turn directional coupler of FIG. 2A with enhanced inductive coupling in accordance with some embodiments. FIG. 4 illustrates a coupler 400 that includes a main line 401 and a coupled line 403, which can be associated with an input port 402, an output port 404, a coupled port 406, and an isolated port 404. The coupler 400 can be similar to the coupler 200 illustrated in FIG. 2A. In an example, the inductive coupling between the main line 401 and the coupled line 403 is enhanced by mutual inductance when the coupled line 403 is routed so that electric signals on both lines 401 and 403 propagate in the same direction (as indicated by the arrows on the main line and coupled line in FIG. 4). For example, the magnetic field 410 (created by the electricity flowing on both lines) can contribute to the mutual inductance between lines 401 and 403.

The coupling between the main line 401 and the coupled line 403 is created by the effective capacitance and inductance between them. The effective resistance in the lines can contribute to coupling loss. Additionally, the directivity can improve with increasing the coupled line 403 length. Ideally, the directional coupler 400 can be designed with minimum loss in the main line 401, which entails minimizing the length of the main line 401. Since higher directivity is desired, the length of the coupled line 403 can be maximized. The coupler design disclosed herein (e.g., 200 and 400) achieves these characteristics by folding the coupled line 403 into multi-turn coil underneath the main line, as illustrated (and discussed above) in reference to FIGS. 2A-3B FIG. 5 is a block diagram illustrating an example device in accordance with some embodiments. In alternative embodiments, the machine operates as a standalone device or may be connected (e.g., networked) to other machines. In a networked deployment, the machine may operate in the capacity of either a server or a client machine in server-client network environments, or it may act as a peer machine in peer-to-peer (or distributed) network environments. The machine may be a wearable device, personal computer (PC), a tablet PC, a hybrid tablet, a personal digital assistant (PDA), a mobile telephone, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. Similarly, the term "processor-based system" shall be taken to include any set of one or more machines that are controlled by or operated by a processor (e.g., a computer) to individually or jointly execute instructions to perform any one or more of the methodologies discussed herein.

Example device 500 includes at least one processor 502 (e.g., a central processing unit (CPU), a graphics processing unit (GPU) or both, processor cores, compute nodes, etc.), a main memory 504 and a static memory 506, which communicate with each other via a link 508 (e.g., bus). The device 500 may further include a video display unit 510, an alphanumeric input device 512 (e.g., a keyboard), and a user interface (UI) navigation device 514 (e.g., a mouse). In one embodiment, the video display unit 510, input device 512 and UI navigation device 514 are incorporated into a touch screen display. The device 500 may additionally include a storage device 516 (e.g., a drive unit), a signal generation device 518 (e.g., a speaker), a network interface device 520, and one or more sensors (not shown), such as a global positioning system (GPS) sensor, compass, accelerometer, gyrometer, magnetometer, or other sensor.

The storage device 516 includes a machine-readable medium 522 on which is stored one or more sets of data structures and instructions 524 (e.g., software) embodying or utilized by any one or more of the methodologies or functions described herein. The instructions 524 may also reside, completely or at least partially, within the main memory 504, static memory 506, and/or within the processor 502 during execution thereof by the computer system 500, with the main memory 504, static memory 506, and the processor 502 also constituting machine-readable media.

While the machine-readable medium 522 is illustrated in an example embodiment to be a single medium, the term "machine-readable medium" may include a single medium or multiple media (e.g., a centralized or distributed database, and/or associated caches and servers) that store the one or more instructions 524. The term "machine-readable medium" shall also be taken to include any tangible medium that is capable of storing, encoding or carrying instructions for execution by the machine and that cause the machine to perform any one or more of the methodologies of the present disclosure or that is capable of storing, encoding or carrying data structures utilized by or associated with such instructions. The term "machine-readable medium" shall accordingly be taken to include, but not be limited to, solid-state memories, and optical and magnetic media. Specific examples of machine-readable media include non-volatile memory, including but not limited to, by way of example, semiconductor memory devices (e.g., electrically programmable read-only memory (EPROM), electrically erasable programmable read-only memory (EEPROM)) and flash memory devices; magnetic disks such as internal hard disks and removable disks; magneto-optical disks; and CD-ROM and DVD-ROM disks.

The instructions 524 may further be transmitted or received over a communications network 526 using a transmission medium via the network interface device 520 utilizing any one of a number of well-known transfer protocols (e.g., HTTP). Examples of communication networks include a local area network (LAN), a wide area network (WAN), the Internet, mobile telephone networks, plain old telephone (POTS) networks, and wireless data networks (e.g., Bluetooth, Wi-Fi, 3G, and 4G LTE/LTE-A or WiMAX networks). The term "transmission medium" shall be taken to include any intangible medium that is capable of storing, encoding, or carrying instructions for execution by the machine, and includes digital or analog communications signals or other intangible medium to facilitate communication of such software.

In an example, the device 500 may further include an RF processing circuit 532, which can include a transceiver circuit 533, an amplifier 536, a directional coupler 534, and one or more monitoring circuits 538. The RF processing circuit can be electrically connected to antenna 530. The functionalities of the directional coupler 534, the amplifier 536, the monitoring circuits 538 and antenna 530 can be similar to the functionalities of comparable circuits discussed above in reference to FIGS. 2A-4.

Additional Notes & Examples

Example 1 is a directional coupler, comprising: a main line provided on a substrate, the main line having a first end connected to an input port and a second end connected to an output port; and a coupled line disposed on the substrate, the coupled line having a first end connected to a coupled port and a second end to an isolated port, wherein the main line is electrically isolated from the coupled line, the coupled line comprises multiple turns forming a winding, and a portion of the winding overlaps with the main line.

In Example 2, the subject matter of Example 1 optionally includes wherein: the coupled line forms a plurality of windings inductively coupled with the main line; and the main line and the coupled line are routed to propagate electric signals on both lines in a same direction, and enhance inductive coupling by mutual inductance.

In Example 3, the subject matter of any one or more of Examples 1-2 optionally include wherein the substrate comprises an upper metal layer and a lower metal layer, the upper metal layer being isolated from the lower metal layer by an isolation layer.

In Example 4, the subject matter of Example 3 optionally includes wherein the main line is disposed on the upper metal layer of the substrate, and wherein the coupled line is disposed on the lower metal layer of the substrate.

In Example 5, the subject matter of any one or more of Examples 3-4 optionally include wherein the main line is disposed on the lower metal layer of the substrate, and wherein the coupled line is disposed on the upper metal layer of the substrate.

In Example 6, the subject matter of any one or more of Examples 1-5 optionally include wherein the main line comprises a metal strip of a first width.

In Example 7, the subject matter of Example 6 optionally includes wherein the coupled line comprises a wire conductor of a second width, and wherein the first width is at least three times larger than the second width.

In Example 8, the subject matter of any one or more of Examples 1-7 optionally include wherein the coupled line is routed to form a plurality of windings, and wherein a contour of the main line overlapping with a contour of each of the plurality of windings.

In Example 9, the subject matter of any one or more of Examples 1-8 optionally include wherein a width of the main line reduces resistive loss between the input port and the output port to below a threshold resistance.

In Example 10, the subject matter of any one or more of Examples 1-9 optionally include wherein a length of the coupled line is to increase a directivity of the directional coupler to above a threshold directivity, wherein the directivity is associated with power level difference between the coupled port and the isolated port when power is provided at the input port.

Example 11 is a directional coupler, comprising: a main line provided on a first metallic layer of a substrate, the main line having a first end connected to an input port and a second end connected to an output port; and a coupled line disposed on a second metallic layer of the substrate, the coupled line having a first end connected to a coupled port and a second end connected to an isolated port, wherein: the main line is electrically isolated from the coupled line via an isolation layer of the substrate; the coupled line comprises multiple turns forming a plurality of windings, the plurality of windings overlapping at least partially with the main line; and the main line and the coupled line are routed so that electric signals on both lines propagate in a same direction, enhancing inductive coupling by mutual inductance between the main line and the coupled line.

In Example 12, the subject matter of Example 11 optionally includes wherein: the main line comprises a metal strip of a first width; and the coupled line comprises a wire conductor of a second width, the first width being larger than the second width.

In Example 13, the subject matter of any one or more of Examples 11-12 optionally include wherein the coupled line is routed to form at least three windings.

In Example 14, the subject matter of any one or more of Examples 11-13 optionally include wherein a contour of the main line overlaps with a contour of each of the three windings.

In Example 15, the subject matter of any one or more of Examples 11-14 optionally include wherein a width of the main line is configured so that resistive loss between the input port and the output port is below a threshold resistance.

In Example 16, the subject matter of any one or more of Examples 11-15 optionally include wherein a length of the coupled line is configured to increase a directivity of the directional coupler above a threshold directivity, wherein the directivity is associated with power level difference between the coupled port and the isolated port when power is provided at the input port.

In Example 17, the subject matter of any one or more of Examples 11-16 optionally include wherein the substrate comprises a lower layer and an upper layer, and wherein the lower layer is isolated from the upper layer.

In Example 18, the subject matter of Example 17 optionally includes wherein the first metallic layer is the upper layer and the second metallic layer is the lower layer.

In Example 19, the subject matter of any one or more of Examples 17-18 optionally include wherein the first metallic layer is the lower layer and the second metallic layer is the upper layer.

Example 20 is an apparatus of a wireless communication device, the apparatus comprising: a directional coupler, the coupler comprising: a main line having a first end connected to an input port and a second end connected to an output port; and a coupled line having a first end connected to a coupled port and at a second end connected to an isolated port; wherein the main line is electrically isolated from the coupled line, the coupled line comprises multiple turns forming a winding, and a portion of the winding overlaps with the main line; a power amplifier coupled to the input port of the main line; and processing circuitry to measure forward power of a transmit signal output by the amplifier at the input port, and adjust signal amplification by the power amplifier based on the measured forward power.

In Example 21, the subject matter of Example 20 optionally includes wherein the processing circuitry generates a feedback signal based on the forward power, and wherein the feedback signal is to adjust magnitude and/or phase of the transmit signal.

In Example 22, the subject matter of any one or more of Examples 20-21 optionally include a second processing circuitry to detect and measure reflected power from an antenna, the reflected power associated with the transmit signal.

In Example 23, the subject matter of Example 22 optionally includes wherein the second processing circuitry is to: dynamically monitor the reflected power; and adjust antenna impedance to match impedance of the power amplifier coupled to the input port, based on the reflected power.

In Example 24, the subject matter of any one or more of Examples 20-23 optionally include an antenna coupled to the output port of the main line.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

What is claimed is:

1. A directional coupler, comprising:
a main line provided on a first portion of a substrate, the main line having a first end connected to a first port and a second end connected to a second port, the main line comprising a first plurality of turns, the first portion including the main line with the first plurality of turns forming a first layer of the substrate; and
a coupled line disposed on a second portion of the substrate, the coupled line having a first end connected to a third port and a second end connected to a fourth port, the second portion with the coupled line forming a second layer of the substrate,
wherein the first layer is electrically insulated from the second layer, the coupled line comprises a single conductor line in the second layer with a second plurality of turns forming a winding, and a portion of the winding overlaps with more than one turn of the first plurality of turns forming the main line, wherein the third port, the fourth port and the single conductor line are within the second layer of the substrate.

2. The directional coupler of claim 1, wherein:
the coupled line forms a plurality of windings inductively coupled with the main line; and
the main line and the coupled line are routed to propagate electric signals on both lines in a same direction, and enhance inductive coupling by mutual inductance.

3. The directional coupler of claim 1, wherein the substrate comprises an upper metal layer and a lower metal layer, the upper metal layer being isolated from the lower metal layer by an isolation layer.

4. The directional coupler of claim 3, wherein the main line is disposed on the upper metal layer of the substrate, and wherein the coupled line is disposed on the lower metal layer of the substrate.

5. The directional coupler of claim 3, wherein the main line is disposed on the lower metal layer of the substrate, and wherein the coupled line is disposed on the upper metal layer of the substrate.

6. The directional coupler of claim 1, wherein the main line comprises a metal strip of a first width.

7. The directional coupler of claim 6, wherein the coupled line comprises a wire conductor of a second width, and wherein the first width is at least three times larger than the second width.

8. The directional coupler of claim 1, wherein the coupled line is routed to form a plurality of windings, and wherein a contour of the main line overlapping with a contour of each of the plurality of windings.

9. The directional coupler of claim 1, wherein a width of the main line reduces resistive loss between the first port and the second port to below a threshold resistance.

10. The directional coupler of claim 1, wherein a length of the coupled line is to increase a directivity of the directional coupler to above a threshold directivity, wherein the directivity is associated with power level difference between the third port and the fourth port when power is provided at the first port.

11. A directional coupler, comprising:
a main line provided on a first metallic layer of a substrate, the main line having a first end connected to a first port and a second end connected to a second port, the main line comprising a first plurality of turns; and
a coupled line disposed on a second metallic layer of the substrate, the coupled line comprising a single continuous conductor line having a first end connected to a third port and a second end connected to a fourth port, wherein:
the first metallic layer with the main line is electrically isolated from the second metallic layer with the coupled line via an isolation layer of the substrate;
the coupled line comprises a second plurality of turns forming a plurality of windings within the second metallic layer, one or more of the second plurality of turns overlapping at least partially with more than one turn of the first plurality of turns of the main line; and
the main line and the coupled line are routed within the first metallic layer and the second metallic layer respectively, so that electric signals on both lines propagate in a same direction, enhancing inductive coupling by mutual inductance between the main line and the coupled line.

12. The directional coupler of claim 11, wherein:
the main line comprises a metal strip of a first width; and
the coupled line comprises a wire conductor of a second width, the first width being larger than the second width.

13. The directional coupler of claim 11, wherein the coupled line is routed to form at least three windings.

14. The directional coupler of claim 11, wherein a contour of the main line overlaps with a contour of each of the three windings.

15. The directional coupler of claim 11, wherein a width of the main line is configured so that resistive loss between the first port and the second port is below a threshold resistance.

16. The directional coupler of claim 11, wherein a length of the coupled line is configured to increase a directivity of the directional coupler above a threshold directivity, wherein the directivity is associated with power level difference between the third port and the fourth port when power is provided at the first port.

17. The directional coupler of claim 11, wherein the main line comprises at least three segments, and wherein neighboring segments of the at least three segments are coupled to each other at a pre-determined angle.

18. An apparatus of a wireless communication device, the apparatus comprising:
a directional coupler, the coupler comprising:
a main line having a first end connected to an input port and a second end connected to an output port, the main line disposed on a single layer of a substrate and comprising a first plurality of turns; and
a coupled line having a first end connected to a coupled port and at a second end connected to an isolated port;
wherein the coupled line comprises a single conductor line with a second plurality of turns forming a winding, a portion of the winding overlaps with at least two of the first plurality of turns forming the main line, and wherein the coupled port, the isolated port and the single conductor line are within a same metallic layer of the substrate which is isolated from the main line;
a power amplifier coupled to the input port of the main line; and
processing circuitry to measure forward power of a transmit signal output by the amplifier at the input port, and adjust signal amplification by the power amplifier based on the measured forward power.

19. The apparatus of claim 18, wherein the processing circuitry generates a feedback signal based on the forward power, and wherein the feedback signal is to adjust magnitude and/or phase of the transmit signal.

20. The apparatus of claim 18, further comprising:
a second processing circuitry to detect and measure reflected power from an antenna, the reflected power associated with the transmit signal.

21. The apparatus of claim 20, wherein the second processing circuitry is to:
dynamically monitor the reflected power; and
adjust antenna impedance to match impedance of the power amplifier coupled to the input port, based on the reflected power.

22. The apparatus of claim 18, further comprising:
an antenna coupled to the output port of the main line.

* * * * *